(12) United States Patent
Kye et al.

(10) Patent No.: US 6,262,909 B1
(45) Date of Patent: Jul. 17, 2001

(54) FERROELECTRIC MEMORY DEVICE (75) Inventors: Hoon Woo Kye; Woo Soon Kang, both of Ichon-shi (KR)

(73) Assignee: Hyundai Electronics Industries Co., Ltd., Kyoungki-do (KR)

( * ) Notice: Subject to any disclaimer, the term of this patent is extended or adjusted under 35 U.S.C. 154(b) by 0 days.

(21) Appl. No.: 09/343,564

(22) Filed: Jun. 30, 1999

(30) Foreign Application Priority Data

Jul. 15, 1998 (KR) .................................................. 98-28736

(51) Int. Cl.[7] .................................................... G11C 11/22
(52) U.S. Cl. ............................................ 365/145; 365/149
(58) Field of Search .................................. 365/145, 149, 365/150

(56) References Cited

U.S. PATENT DOCUMENTS

| | | | |
|---|---|---|---|
| 5,392,234 | * 2/1995 | Hirano et al. | 365/145 |
| 5,600,587 | 2/1997 | Koike | 365/145 |
| 5,926,413 | * 7/1999 | Yamada et al. | 365/145 |
| 6,038,160 | * 3/2000 | Nakane et al. | 365/145 |

* cited by examiner

Primary Examiner—Tan T. Nguyen
(74) Attorney, Agent, or Firm—Nath & Associates PLLC; Gary M. Nath; Harold L. Novick (57) ABSTRACT

Disclosed is a ferroelectric memory device having a memory cell structure where a plurality of ferroelectric capacitor are connected to one switching transistor, and a plurality of data are outputted according to one address input. The ferroelectric memory device comprises a plurality of word lines for driving a corresponding memory cell in accordance with an input address; a plurality of bit lines crossing said word lines, respectively; a plurality of switching transistors connected both to the bit lines and the word lines, respectively; and a plurality of dielectric capacitors wherein one end is coupled in common to a node of the switching transistor, respectively; wherein a plurality of output data are outputted by selecting a memory cell including at least one switching transistor corresponding to the plurality of switching transistors, and to the plurality of dielectric capacitors.

9 Claims, 7 Drawing Sheets

FERROELECTRIC MEMORY DEVICE

BACKGROUND OF THE INVENTION

1. Field of the Invention

This invention relates to a memory device, and more particularly to a ferroelectric memory device in which a switching transistor is coupled to a plurality of ferroelectric capacitors, thereby outputting a plurality of information when an address signal is inputted.

2. Description of the Prior Art

It is well known that the ferroelectric memory element has been gaining importance as a next generation memory since it has non-volatile characteristics. The memory including a plurality of ferroelectric material can be a non-volatile memory by using the characteristics that maintain a constant charge amount for the ferroelectric material characteristics even if the potential difference in both ends of a capacitor does not exist.

Figure 1A:
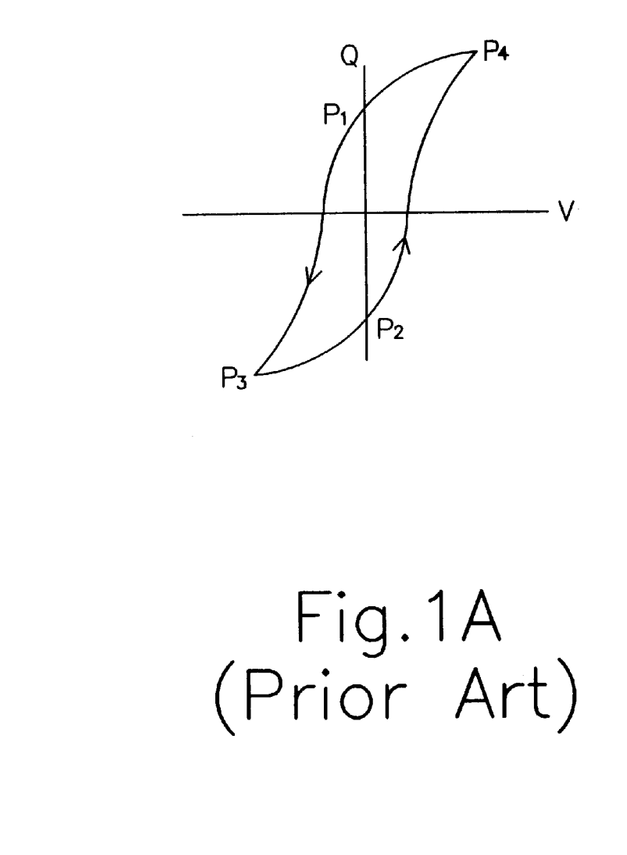
FIG. 1A shows a symbol of a ferroelectric capacitor.
Figure 1B:
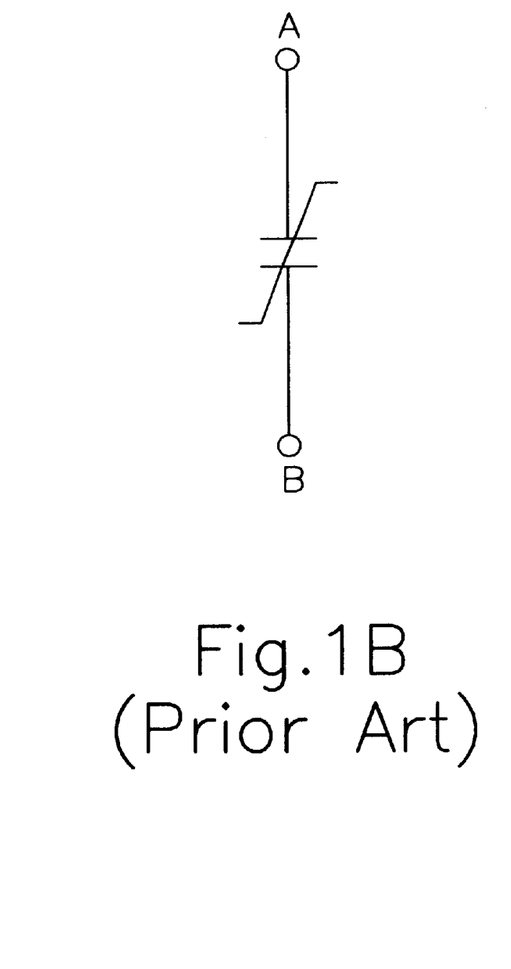
FIG. 1B is a graph showing the charge amount vs voltage curve.

FIG. 1A shows a symbol of a ferroelectric capacitor, and FIG. 1B is a graph showing the charge amount vs voltage curve where the ferroelectric capacitor has a hysterisis relationship between the voltage and the charge. As shown in the hysterisis curve, even if the voltage in both ends of a capacitor is 0V, binary information can be memorized since the constant charge amount is maintained as a state "P1" or "P2", unlike linear capacitors. This is due to the fact that the atomic arrangement of the ferroelectric material is polarized when the electric field is applied to and cut off from the ferroelectric material. This is the very reason that the memory used by the ferroelectric capacitor as a storage means, can be a non-volatile memory. Another feature of the ferroelectric capacitor is that the charge amount curve according to the voltage or potential has a hysterisis relationship. Any voltage which is lower than −3V is applied to the ferroelectric capacitor, the polarization state of the ferroelectric material is changed and then the charge amount is moved to state "P3" as depicted in FIG.1B. While the minus voltage is changed to plus voltage, the charge amount is moved to state "P4" through state "P2". Thus, the charge amount for the ferroelectric capacitor is changed along with arrow direction in accordance with the voltage variation as depicted by the arrow direction in FIG. 1B.

There are many cases wherein the ferroelectric capacitors are applied to the memory elements. A ferroelectric memory cell generally includes one witching transistor and one dielectric capacitor. Also, a memory array having a plurality of memory cell includes a plurality of word lines for driving each switching transistor and bit lines for sensing and amplifying the charge amount stored in capacitors. Each word line and bit line is connected so that they cross each other. Each word line is connected to the gate of each switching transistor to control the switching on/off operation, each bit line is connected to a source of each switching transistor, and one end of each dielectric capacitor is connected to a drain of each switching transistor, respectively. The other end of the electric capacitor is connected to each plate line, respectively. In order to detect or store the charge which is stored in a dielectric capacitor in the ferroelectric memory element, an electric field is applied to both ends of each capacitor.

Figure 2:
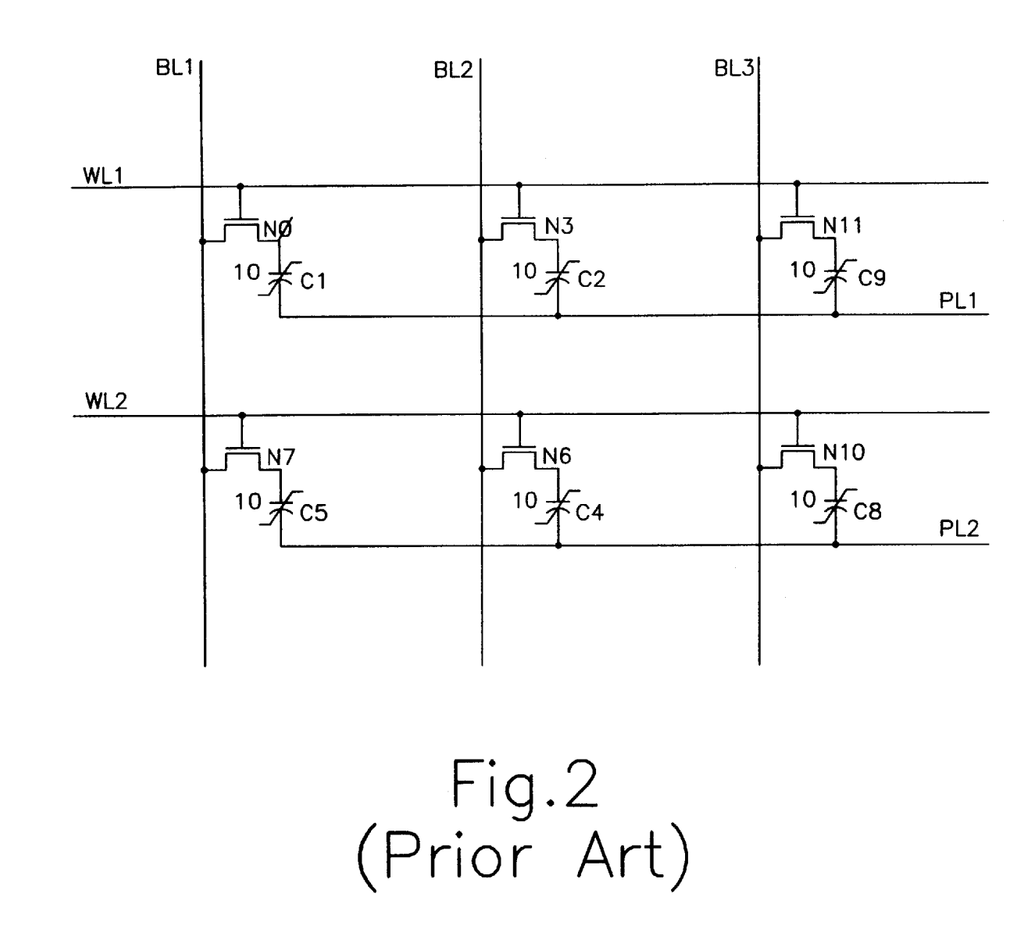
FIG. 2 is a circuit diagram showing a related ferroelectric memory device including a switching transistor and a dielectric capacitor.

FIG. 2 is a circuit diagram showing a related ferroelectric memory device including a switching transistor and a dielectric capacitor. Here, one bit information of "0" or "1" digit is stored in the capacitor. But, an address signal is generally applied to the memory device, and a plurality of output signals, (i.g. 1,8,16,32, . . . etc.) are outputted by driving switching transistors corresponding to the number of the output signals. For example, if a memory device, which is set to output 8 bits (i.e. 1 byte) at a certain time, is accessed by an input address, 8 switching transistors are turned on in order to output the corresponding data. However, as the memory device requires a large numner of output data, the level of the circuit complexity may be highly increased in proportion to the number of the switching transistors. Accordingly, there are problems including the increase of power consumption and the enlargement of the total chip area of the memory device which leads to further circuit complexity.

SUMMARY OF THE INVENTION

Therefore, an objective of the present invention is to solve the disadvantages involved in the prior art, and to provide a ferroelectric memory device having a memory cell structure where a plurality of ferroelectric capacitors are connected to one switching transistor, and a plurality of data are outputted according to one address input.

The other objective of the present invention is to provide a ferroelectric memory device having a memory cell structure where both a chip area is reduced and a plurality of information is obtained by using the minimum switching transistors.

In order to achieve the above objectives, a ferroelectric memory device is provided, comprising a plurality of word lines for driving a corresponding memory cell in accordance with an input address; a plurality of bit lines crossing said word lines, respectively; a plurality of switching transistors connected both to said bit lines and said work lines, respectively; and a plurality of dielectric capacitors whose one end coupled to a node of said switching transistor, respectively; wherein a plurality of data are outputted by selecting one memory cell including at least one switching transistor corresponding to the plurality of switching transistor, and the plurality of dielectric capacitors.

It is desired that a memory cell of a ferroelectric memory device according to the present invention includes a switching transistor and a plurality of dielectric capacitors, and the number of each said switching transistor is determined by $2^N$ (N=0,1,2,3 . . .) sequence such as 2, 4, 6, 8 . . . etc.

Further, the ferroelectric memory device according to the present invention further includes a plurality of plate lines connected to the other ends of the plurality of dielectric capacitors, respectively; and a plurality of sensing amplifiers, coupled to said plate lines, respectively, for sensing and amplifying the voltage variation of each said plate line.

Here, cell data are sensed and amplified through each plate line and then are outputted.

In order to achieve another objective, a ferroelectric memory device is provided, comprising a plurality of word lines for driving a corresponding memory cell in accordance with an input address; a plurality of bit lines crossing said word lines, respectively; a plurality of first switching transistors connected both to bit lines and said work lines, respectively; a plurality of second switching transistors connected in common to said word lines and said bit lines which are connected to said first switching transistors, respectively; a plurality of first dielectric capacitor group whereine each capacitor is connected in common to one node of said first switching transistor, respectively; a plurality of second dielectric capacitor group wherein each capacitor is connected in common to one node of said second switching transistor, respectively; wherein a plurality of output data are outputted by selecting a memory cell.

Further, the ferroelectric memory device according to the present invention further includes a plurality of plate lines connected to the other ends of the plurality of first and second dielectric capacitors, respectively; and a plurality of sensing amplifiers, coupled to said plate lines, respectively, for sensing and amplifying a voltage variation of each said plate line.

Here, cell data are sensed and amplified through each plate line and then are outputted, and the sensing amplifiers are connected in common to a plurality of plate lines which belong to the other column.

BRIEF DESCRIPTION OF THE DRAWINGS

The above objectives and other features of the present invention will become more apparent by describing the preferred embodiments thereof with reference to the accompanying drawings, in which.

DETAILED DESCRIPTION OF THE PREFERRED EMBODIMENT

Now, the preferred embodiments of the present invention configured as above are explained in detail in connection with the attached drawings.

Figure 3:
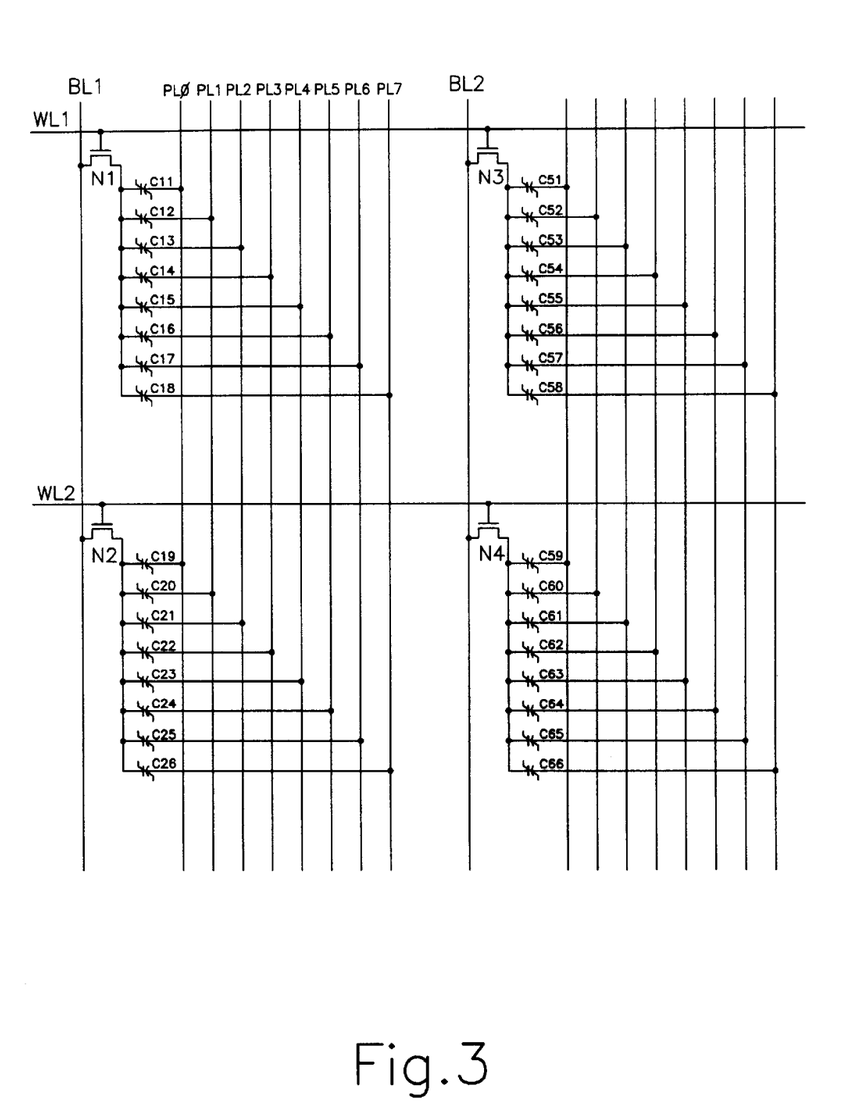
FIG. 3 is a circuit diagram showing a ferroelectric memory device including a switching transistor and a dielectric capacitor according to a first preferred embodiment of the present invention.

FIG. 3 is a circuit diagram showing a ferroelectric memory device including a switching transistor and a dielectric capacitor according to the first preferred embodiment of the present invention.

With reference to FIG. 3, a ferroelectric memory device according to the present invention, comprises a plurality of word lines WL1 and WL2 for driving a corresponding memory cell in accordance with an input address, a plurality of bit lines BL1 and BL2 crossing said word lines, respectively, a plurality of switching transistors N1 to N4 connected to said bit lines BL1 and BL2 and said work lines WL1 and WL2, respectively, and a plurality of dielectric capacitors C11 to C26 and C51 to C66 whose one end is coupled in common to a node of said switching transistors N1 to N4, respectively. FIG. 3 illustrates the structural features so that the subject of the present invention where 4 memory cells are depicted as a preferred embodiment can be easily understood.

Here, one memory cell includes a switching transistor and a plurality of dielectric capacitors. Also, it is desired that the numbers of the dielectric capacitors are in a $2^N$ sequence such as 2, 4, 8, . . . etc. In FIG. 3, the number of the dielectric capacitors is 8.

The ferroelectric memory device of the present invention is coupled to a plurality of plate lines which are connected to the plurality of dielectric capacitors, respectively.

In FIG. 3, in accordance with the number of dielectric capacitors for making one memory cell, 8 plate lines are included in the same column and connected to each dielectric capacitor, respectively. The cell data is sensed and amplified in each plate line and outputted thereof.

In FIG. 3, 8 ferroelectric capacitors are connected to one switching transistor. Thus, a gate of the transistor N1 is connected to the word line WL1 to control the on/off operation of the transistor N1, and a drain of the transistor N1 is connected to bit line BL1. A source of the transistor is connected in common to one end of the 8 dielectric capacitors. The other end of the 8 dielectric capacitorss is connected to 8 plate lines.

Figure 4:
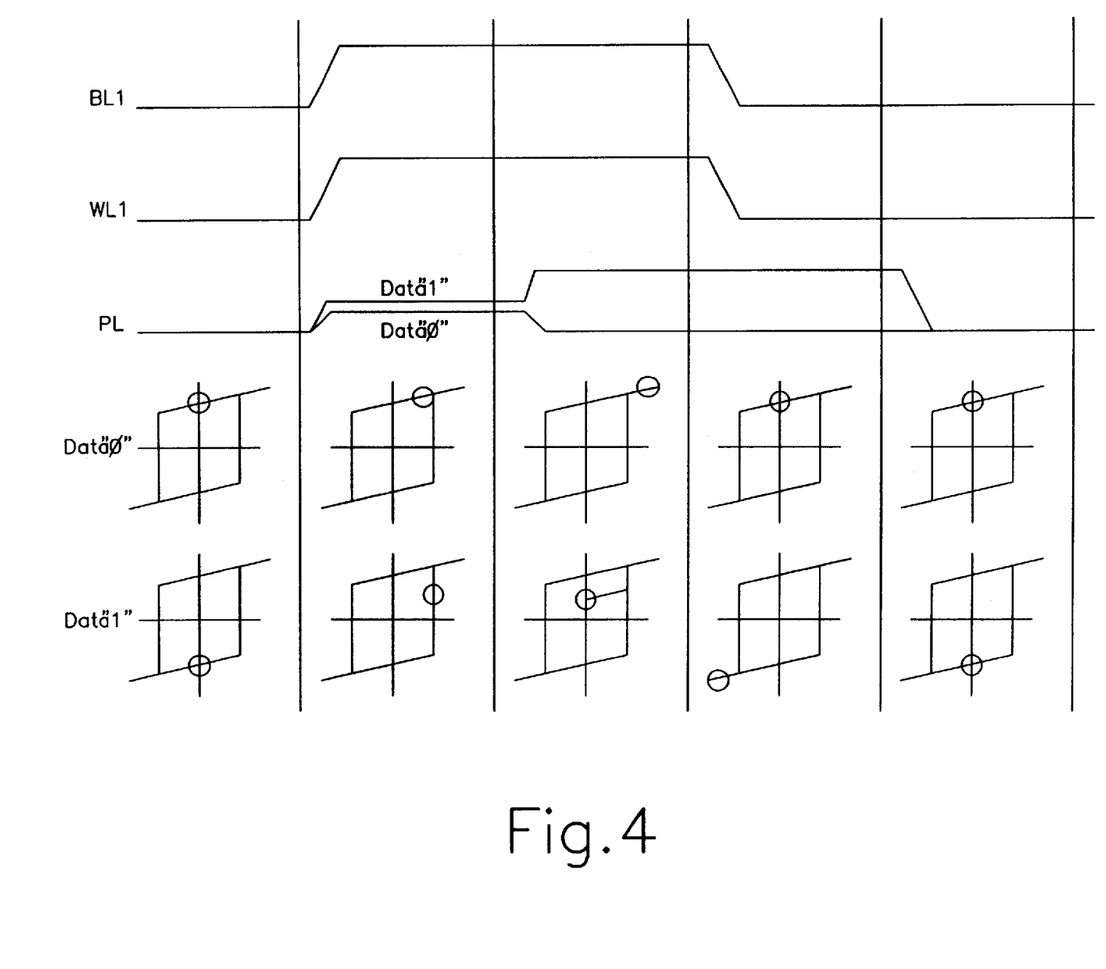
FIG. 4 is a timing diagram for reading memory cells of the present invention, and it illustrates the polarization states of the hysterisis curve.

FIG. 4 is a timing diagram for reading the memory cells of the present invention, and it illustrates the polarization states of the hysterisis curve. With reference to FIG. 4, if the ferroelectric capacitors C11 to C18, which are connected to the switching transistor N1, are selected, the word line WL1 is also selected and thereby turning on the switching transistor N1. Accordingly, the voltage of both ends of the ferroelectric capacitor is made as Vcc, since the level of the bit line BL1 connected to the switching transistor N1 is transited to a high level. Accordingly, the charge stored is pre-charged with 0V since the charge is held in common with a parasitic capacitor of the plate line through the ferroelectric capacitor, thereby causing the voltage variation. The potential of the case where data "1" is stored is increased more than the case where data "0" is stored, since the charge also increases in the same manner. Thus, data stored in the 8 memory cells are transferred to the 8 plate lines at one time.

According to the preferred embodiment of the present invention, the chip area is reduced more than in the cell structure of the related art of one transistor vs one capacitor since the switching transistors are largely reduced, considering the cell structure for reading out stored information.

Figure 5:
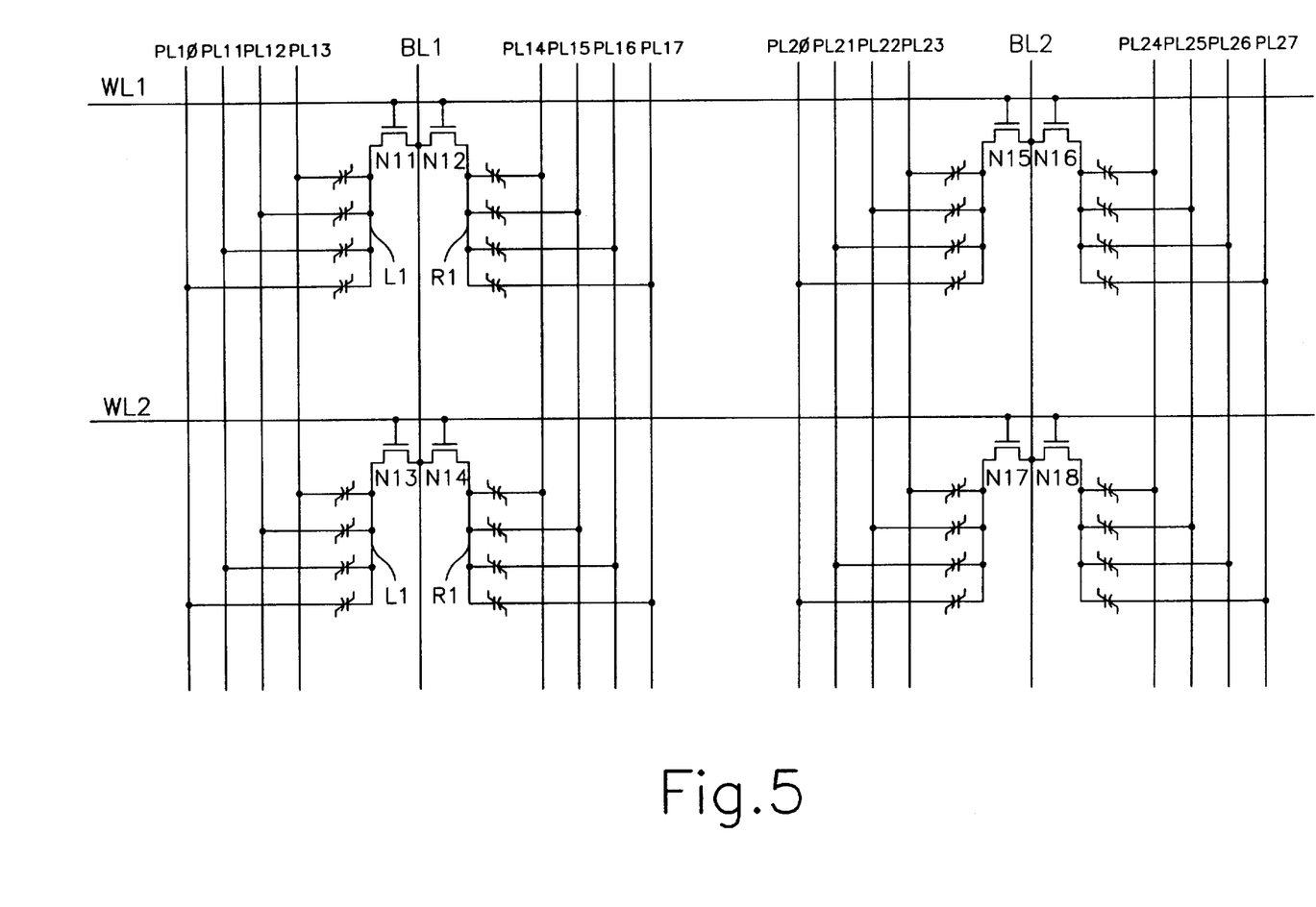
FIG. 5 is a circuit diagram showing a ferroelectric memory device including two switching transistors and a plurality of dielectric capacitors according to the other preferred embodiment of the present invention.

FIG. 5 is a circuit diagram showing a ferroelectric memory device including two switching transistors and a plurality of dielectric capacitors according to the other preferred embodiment of the present invention, where data is transferred through plate lines PL10 to PL17 since two switching transistors are selected simultaneously. With reference to FIG. 5, the ferroelectric memory device comprises word lines WL1 and WL2 for driving corresponding memory cell in accordance with an input address; bit lines BL1 and BL2 crossing the word lines WL1 and WL2, respectively; first switching transistors N11,N13,N15 and N17 connected to the bit lines BL1 and BL2 and the work lines WL1 and WL2, respectively; second switching transistors N12,N14,N16 and N18 connected in common to the bit lines BL1 and BL2 and the work lines WL1 and WL2 which are connected to the first switching transistors Nll, N13,N15 and N17, respectively; first dielectric capacitor group L1 whrerin each capacitor is connected in common to one node of the first switching transistors N11,N13,N15 and N17, respectively; second dielectric capacitor group R1 wherein each capacitor is connected in common to one node of the second switching transistors N12,N14,N16 and N18, respectively.

The ferroelectric memory devices depicted in FIG. 3 and FIG. 5 output 8 data information by selecting one memory cell, while the ferroelectric memory device of FIG. 5 includes two switching transistors and 4 dielectric capacitors which are coupled to each switching transistor, and thus, the two switching transistors are driven by selecting only one word line and bit line.

Figure 6:
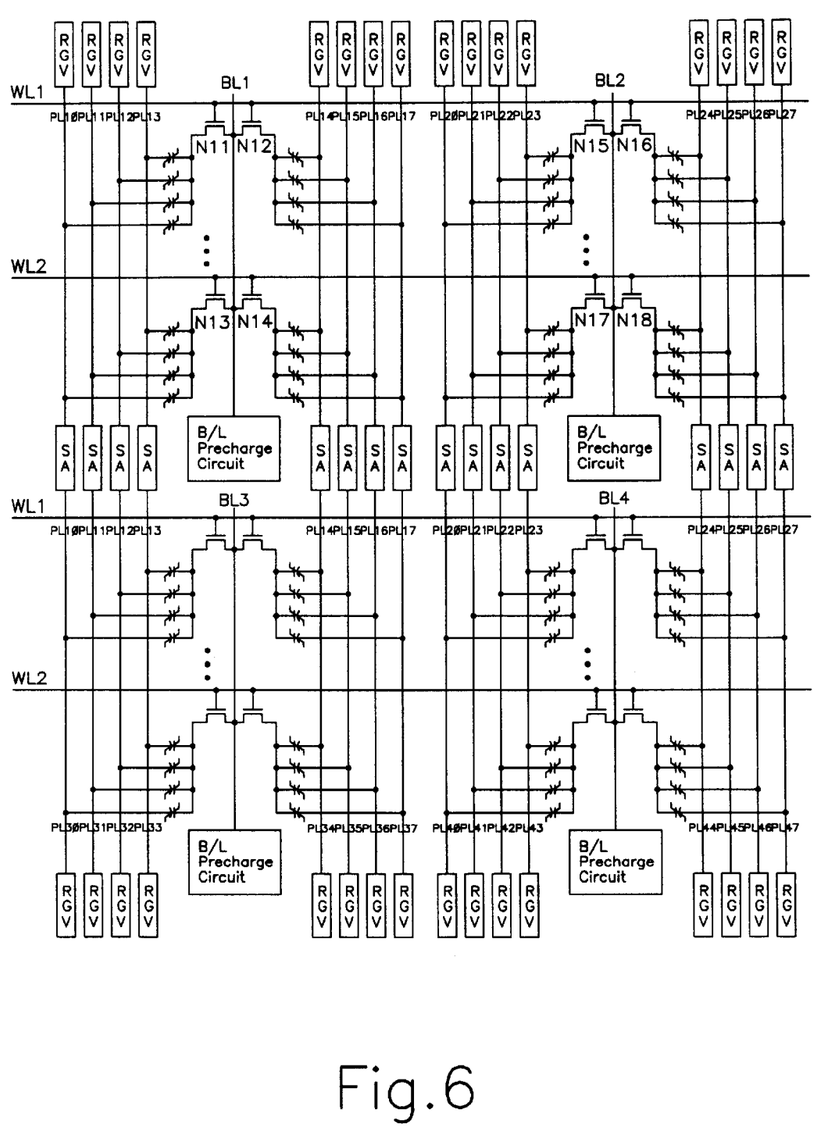
FIG. 6 is a circuit diagram showing a ferroelectric memory device of the present invention to which an open bit line structure is applied.

FIG. 6 is a circuit diagram showing a ferroelectric memory device of the present invention to which open bit line structure is applied. Each sensing amplifier is coupled to each plate line, and sensing and amplifying data which are transferred through the plate line. At this time, the sensing amplifier requires reference voltage where each reference voltage generator for generating reference voltage is coupled to each plate line. If data are transferred through plate lines PL11 to PL17 by selecting two switching transistors N11 and N12, the reference voltage generator, which is connected to the opposite node of the sensing amplifier, operates so that reference voltages are transferred through the plate lines PL30 to PL37, respectively.

Figure 7:
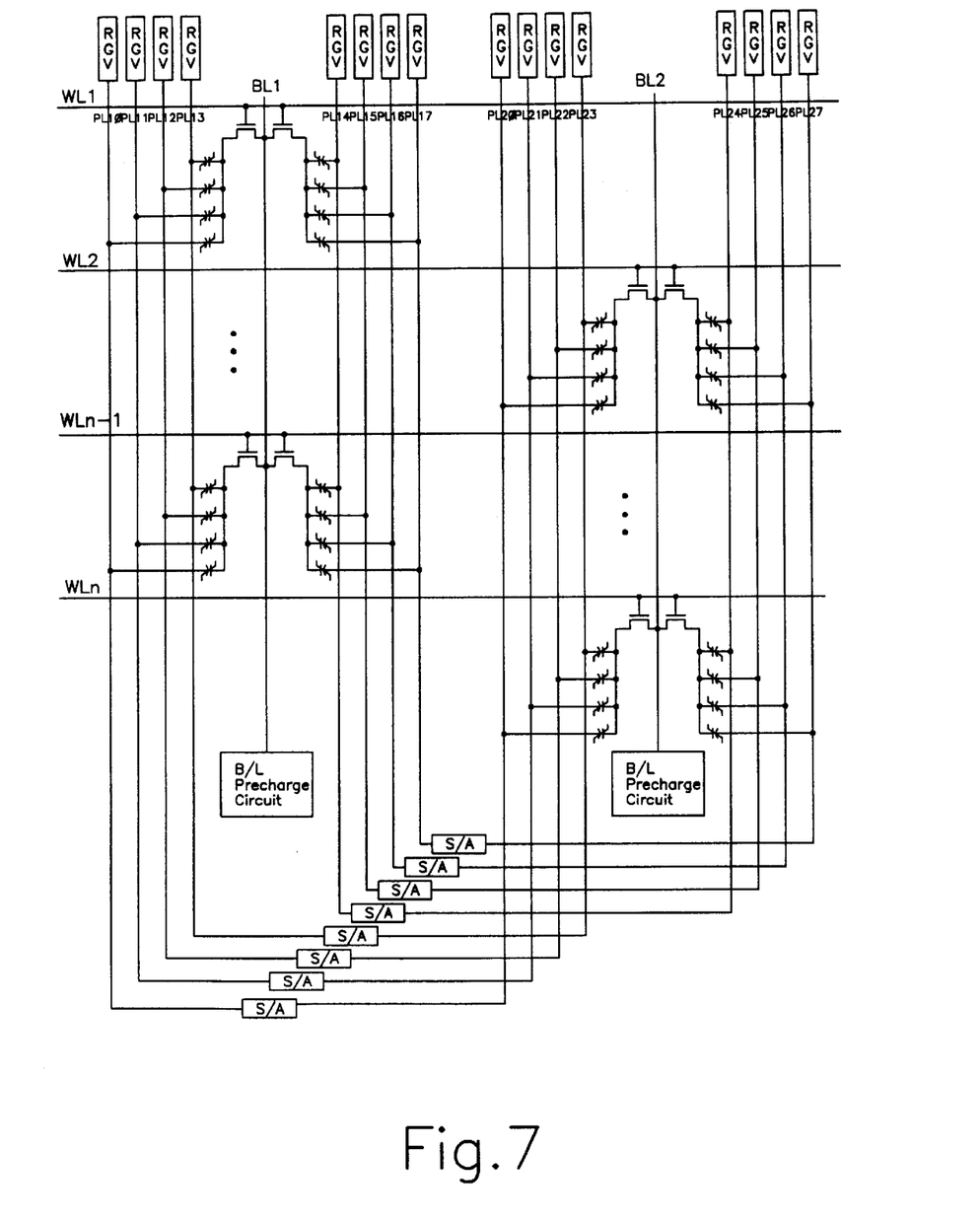
FIG. 7 is a circuit diagram showing a ferroelectric memory device of the present invention to which a folded bit line structure is applied.

FIG. 7 is a circuit diagram showing a ferroelectric memory device of the present invention to which a folded bit line structure is applied. As shown in FIG. 7, the reference voltage for the sensing amplifier is obtained from another plate line which belongs to the other column, dissimilar the structure of FIG. 6.

As described in the above descriptions, the present invention is possible in light of the above teachings. Therefore, it is to be understood that within the scope of the appended claims, the invention may be practiced in various ways other than those specifically described.

For example, even if the ferroelectric memory device of the present invention outputs 8 data information at a time by selecting one memory cell, it is to be easily understood that the other embodiment of the memory cell, in which the number of the dielectric capacitors can be varied according to the required number of output data at a time, is available. Also, the present invention discloses that 8 dielectric capacitors are coupled to one switching transistor, or 4 dielectric capacitors are coupled to two switching transistor, respectively.

Accordingly, when the memory device is required to store a large amount of output data, the circuit complexity may be decreased in proportion to the amount. Further, the power consumption is reduced and the chip area of the memory device is minimized thereof.

What is claimed is:

1. A ferroelectric memory device, comprising:
   a plurality of word lines for driving corresponding a plurality of memory cells in response to input addresses;
   a plurality of bit lines crossing said word lines, respectively;
   a plurality of switching transistors connected both to said bit lines and said work lines, respectively; and
   a plurality of dielectric capacitors whose one end is coupled in common to a node of said switching transistors, respectively;
   wherein a plurality of data are outputted by selecting a memory cell including at least one switching transistor corresponding to the plurality of switching transistors, and to the plurality of dielectric capacitors.

2. The ferroelectric memory device according to claim 1, further comprising;
   a plurality of plate lines connected to the other end of the plurality of dielectric capacitors, respectively; and
   a plurality of sensing amplifiers, coupled to said plate lines, respectively, for sensing and amplifying a voltage variation of each said plate line.

3. The ferroelectric memory device according to claim 2, wherein the number of each said switching transistor is determined by a $2^N$ (N=0,1,2,3 . . . ) sequence.

4. A ferroelectric memory device, comprising:
   a plurality of word lines for driving corresponding a plurality of memory cells in response to input addresses;
   a plurality of bit lines crossing said word lines, respectively;
   a plurality of first switching transistors connected both to said bit lines and said word lines, respectively;
   a plurality of second switching transistors connected in common to said word lines and said bit lines which are connected to said first switching transistors, respectively;
   a plurality of first dielectric capacitor group wherein each capacitor is connected in common to one node of said first switching transistor, respectively;
   a plurality of second dielectric capacitor group wherein each capacitor is connected in common to one node of said second switching transistor, respectively;
   wherein a plurality of output data are outputted by selecting a memory cell.

5. The ferroelectric memory device according to claim 4, further comprising:
   a plurality of plate lines connected to the other ends of the plurality of first and second dielectric capacitors, respectively; and
   a plurality of sensing amplifiers, coupled to said plate lines, respectively, for sensing and amplifying a voltage variation of each said plate line.

6. The ferroelectric memory device according to claim 5, wherein said sensing amplifier is operated by receiving a reference voltage from a reference voltage generator provided in the ferroelectric memory device.

7. The ferroelectric memory device according to claim 5, wherein each said sensing amplifier is coupled with plate line belonging to other columns, and receives a reference voltage from each the plate line belonging to other column.

8. The ferroelectric memory device according to claim 4, wherein said bit lines are composed of folded bit line structure.

9. The ferroelectric memory device according to claim 4, wherein said bit lines are composed of open bit line structure.

* * * * *

UNITED STATES PATENT AND TRADEMARK OFFICE
CERTIFICATE OF CORRECTION

PATENT NO. : 6,262,909 B1
DATED : July 17, 2001
INVENTOR(S) : Kye et al.

It is certified that error appears in the above-identified patent and that said Letters Patent is hereby corrected as shown below:

Claim 1,
Line 8, change "work" to -- word --.

Signed and Sealed this

Twenty-seventh day of November, 2001

Attest:

*Nicholas P. Godici*

NICHOLAS P. GODICI
*Attesting Officer*   *Acting Director of the United States Patent and Trademark Office*